United States Patent [19]

Liou

[11] Patent Number: 5,234,852
[45] Date of Patent: Aug. 10, 1993

[54] SLOPED SPACER FOR MOS FIELD EFFECT DEVICES COMPRISING REFLOWABLE GLASS LAYER

[75] Inventor: Fu-Tai Liou, Carrollton, Tex.

[73] Assignee: SGS-Thomson Microelectronics, Inc., Carrollton, Tex.

[21] Appl. No.: 860,112

[22] Filed: Mar. 30, 1992

Related U.S. Application Data

[63] Continuation of Ser. No. 595,109, Oct. 10, 1990, abandoned.

[51] Int. Cl.⁵ ............................................. H01L 21/336
[52] U.S. Cl. ...................................... 437/44; 437/982; 437/240; 257/335; 257/336; 148/DIG. 133
[58] Field of Search ............... 437/40, 41, 44, 235, 437/238, 239, 240, 982, 983; 148/DIG. 118, DIG. 133; 357/23.3

[56] References Cited

U.S. PATENT DOCUMENTS

| | | | |
|---|---|---|---|
| 4,382,826 | 5/1983 | Pfleiderer et al. | 437/44 |
| 4,728,617 | 3/1988 | Woo et al. | 437/44 |
| 4,755,479 | 7/1988 | Miura | 437/44 |
| 4,764,477 | 8/1988 | Chang et al. | 437/44 |
| 4,886,765 | 12/1989 | Chen et al. | 437/41 |
| 4,948,744 | 8/1990 | Kita | 437/44 |
| 4,981,810 | 1/1991 | Fazan et al. | 437/44 |

*Primary Examiner*—Mary Wilczewski
*Attorney, Agent, or Firm*—Kenneth C. Hill; Lisa K. Jorgenson; Richard K. Robinson

[57] ABSTRACT

A method for forming field effect devices having lightly doped drain regions requires only a single dope and implant step. After patterning of the polycrystalline silicon gates, sloped sidewall spacers are formed alongside the gates. These spacers have a relatively linear slope from the top corners of the polycrystalline silicon gates to the substrate. A single implant of dopant results in heavily doped regions beyond the sidewall spacers with more lightly, and shallowly, doped regions next to the channel.

5 Claims, 1 Drawing Sheet

SLOPED SPACER FOR MOS FIELD EFFECT DEVICES COMPRISING REFLOWABLE GLASS LAYER

This application is a continuation-in-part of U.S. patent application Ser. No. 07/595,109, filed Oct. 10, 1990, now abandoned.

BACKGROUND OF THE INVENTION

1. Field of the Invention

The present invention relates generally to integrated circuit devices, and more specifically to insulated gate field effect devices.

2. Description of the Prior Art

The performance of semi-conductor field effect devices has been greatly improved since the use of sidewall spacers on polycrystalline silicon gates has become common. The spacers allow formation of a lightly doped drain (LDD) region next to the channel region.

Such devices are formed by making a light phosphorus implant to form the lightly doped drain regions, followed by formation of sidewall oxide spacers on the sides of the polycrystalline silicon gate. These spacers are formed by depositing a conformal layer of oxide over the integrated circuit, and anisotropically etching this layer. Following sidewall spacer formation, heavily doped drain regions are formed by implanting arsenic. The sidewall spacers protect the lightly doped drain regions from the arsenic implant.

The formation of lightly doped drain regions is useful because doing so allows fabrication of small transistors that do not suffer from the "hot electron" effect. Smaller devices translate directly into a higher device packing density on the integrated circuit. This in turn translates to faster, less expensive circuits.

One disadvantage of LDD formation is the extra manufacturing steps involved. Even though both light and heavy drain doping are self-aligned, two separate implants of different materials must be made. The implants cannot be made without removing the wafer containing the integrated circuit from the implanter because the oxide sidewalls must be formed between implant steps. This adds some complexity to the process flow, and cost to the integrated circuit.

It would be desirable to provide a technique for forming lightly doped drain regions which is simpler than current processes. It is further desirable for such a technique to provide good device characteristics for the field effect transistors formed thereby.

SUMMARY OF THE INVENTION

It is therefore an object of the present invention to provide a method for forming lightly doped drain regions in field effect devices.

It is another object of the present invention to provide such a method which simplifies the device fabrication process flow.

It is a further object of the present invention to provide such a method which results in transistors having improved operating characteristics.

Therefore, according to the present invention, a method for forming field effect devices having lightly doped drain regions requires only a single dope and implant step. After patterning of the polycrystalline silicon gates, sloped sidewall spacers are formed alongside the gates. These spacers have a relatively linear slope from the top corners of the polycrystalline silicon gates to the substrate. A single implant of dopant results in heavily doped regions beyond the sidewall spacers with more lightly, and shallowly, doped regions next to the channel.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
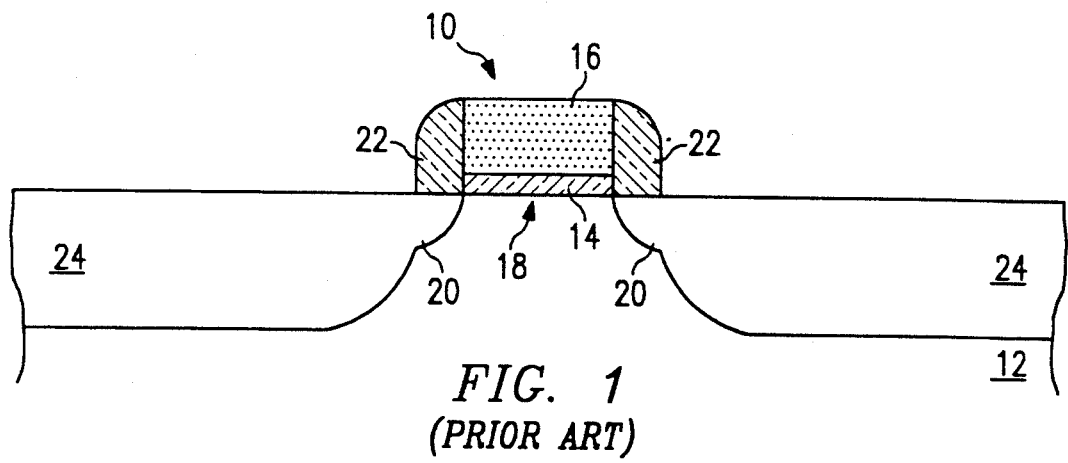
FIG. 1 is a cross sectional view illustrating a field effect device as known in the prior art.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing crosssections of portions of an integrated circuit during fabrication are not drawn to scale, but instead are drawn so as to illustrate the important features of the invention.

Referring to FIG. a transistor designated generally as reference number 10 is formed in a semiconductor substrate 12. The transistor includes a gate oxide 14 which separates a polycrystalline silicon gate 16 from an underlying channel region 18. As known in the art, the gate 16 may be formed from doped polycrystalline silicon, or polycrystalline silicon alloyed with a refractory metal to form a polycide.

Lightly doped drain (LDD) regions 20 are disposed on either end of the channel region 18 to provide improved transistor performance as known in the art. Sidewall oxide regions 22 are adjacent to the polycrystalline silicon gate 16, and are used as implant masks to form the LDD regions 20 as known in the art. Heavily doped source/drain regions 24 complete the structure of the transistor 10.

As known in the art, LDD regions 20 are formed by making a light implant after the gate 16 and gate oxide 14 have been defined. Sidewall oxide spacers 22 are then formed, followed by a heavy implant to form source/drain regions 24. In the case of an N-channel transistor, the light implant is usually made using phosphorus, with arsenic used for the heavy, source/drain implant.

Figure 2:
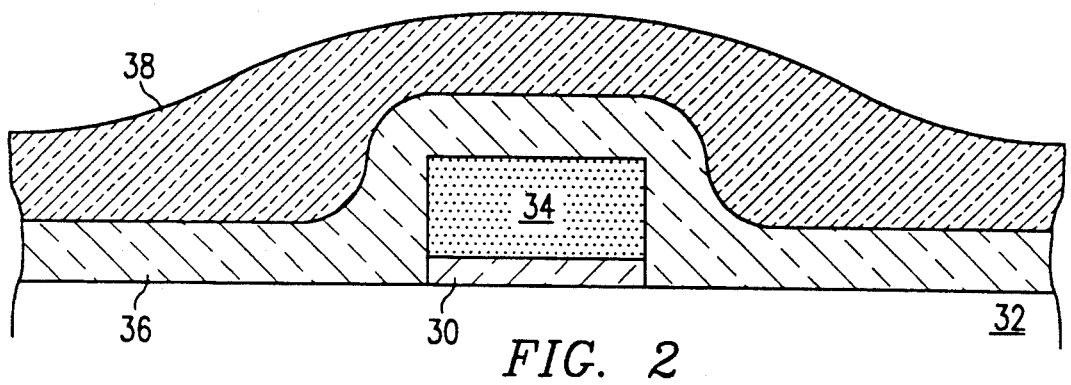
FIGS. 2, 3, and 4 are cross sectional views of an integrated circuit illustrating the present invention.
Figure 3:
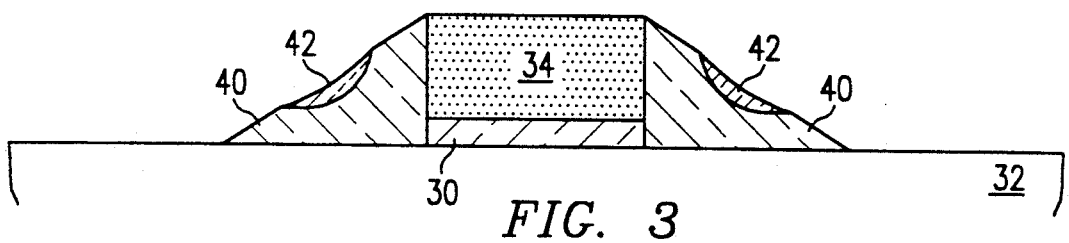
Figure 4:
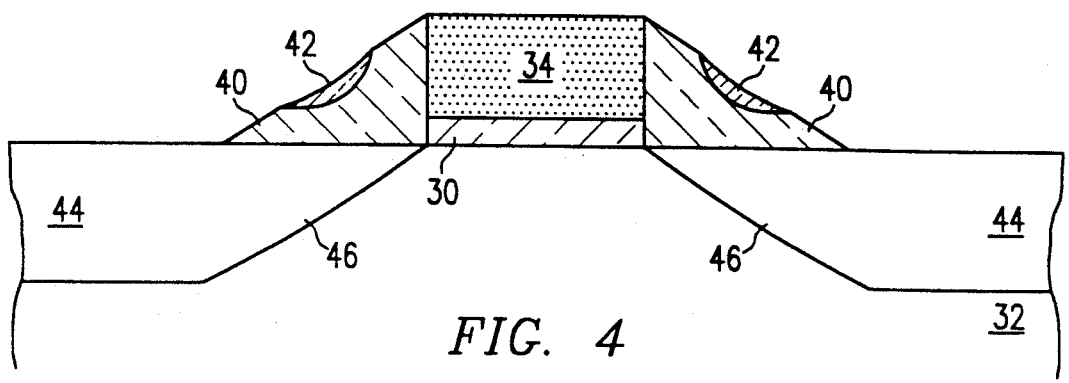

A method for forming a transistor according to the present invention is illustrated in FIGS. 2–4. Referring to FIG. 2, a gate oxide layer 30 is grown on a semi-conductor substrate 32. A layer of polycrystalline silicon 34 is formed over the gate oxide layer 30, and may be whole or partially converted into a refractory metal silicide as known in the art. The gate oxide layer 30 and polycrystalline layer 34 are then patterned and etched to define the gate structure illustrated in FIG. 2. Processing of the integrated circuit has been conventional up to this point.

An oxide layer 36 is then deposited, preferably to a thickness of between approximately 200 and 2000 angstroms. Oxide layer 36 is deposited using a process which forms a conformal layer, such as chemical vapor deposition oxide layer 36 is typically undoped. Another oxide layer 38 is then formed over oxide layer 36. Layer 38 is preferably formed from a material which can be made somewhat planar compared with the topology of the integrated circuit. Materials suitable for formation of layer 38 are various kinds of glasses or insulators which can be made to reflow when heated, such as boro-phospho-silicate glass (BPSG) or boron doped glass (BSG). Once BPSG or another reflow glass is deposited, the integrated circuit is heated to allow the layer 38 to flow partially into lower regions on the integrated circuit, resulting in a layer 38 having cross section approximating that shown in FIG. 2. Heating can be performed using rapid thermal processing (RTP) as known in the art.

Referring to FIG. 3, the oxide layers 36, 38 are anisotropically etched back to form oxide spacers 40. The layers 36 and 38 etch at substantially the same rate, so that the upper surfaces of oxide spacers 40 have approximately the same slope as the upper surface of layer 38 had prior to etch back. Depending upon the thickness of layer 36 as deposited, and the slope of layer 38 prior to etch back, the sidewall spacers 40 may include small regions 42 formed from the remnants from layer 38. The remainder of the spacer 40 is formed from the conformal oxide originally deposited as layer 36.

Formation of the undoped oxide layer 36, and the doped oxide layer 38, and the heating to reflow by RTP, can all be integrated into a single processing step using the so-called "cluster tools" now becoming available. The anisotropic etchback used to form the sidewall spacers 40 can also be integrated into the single cluster step.

Referring to FIG. 4, an implant of a dopant used to form source/drain regions 44 is made. The sidewall spacers 40 absorb a portion of the dopant, resulting in lightly doped drain regions 46. Lightly doped drain regions 46 have an impurity profile which approximates, in shape, the upper surface of sidewall spacers 40.

The processing steps set forth above result in lightly doped drain regions 46 which have a continuously varying depth and dopant concentration profile, as opposed to the step-like profile formed by prior art LDD formation processes. The shape and size of lightly doped drain regions 46 can be varied by varying the slope of the upper surface of layer 38 prior to etch back, which in turn is controlled by varying the thickness and reflow time used to form such layer. The implant used to form source drain regions 44 and LDD regions 46 can be a single element, such as phosphorus or arsenic for an N-channel device, or may be a combination of two materials implanted sequentially, preferably without removing the integrated circuit from the ion implanter.

The technique described above provides for all dielectric formation to be performed at one stage of the processing, followed by all implanting to be performed at another stage of the processing. It is not necessary to alternate dielectric formation and dopant implanting steps as required in the prior art. Thus, the process flow is simplified somewhat, while providing a field effect device having good operating characteristics.

It will be appreciated by those skilled in the art that the sloped spacers formed as described above will form sloped sidewalls along all vertical surfaces which exist on the integrated circuit in addition to the gate regions. These sloped sidewalls on the transistor gates, and elsewhere, have the further benefit that they help alleviate step coverage problems in the source/drain regions and elsewhere. As known in the art, prior art sidewall spacers have substantially vertical sides adjacent the source/drain regions and can provide step coverage problems when very small source/drain contacts are used. Sidewall spacers formed as described above thus provide a secondary benefit of minimizing or eliminating some step coverage problems as well as providing an improved LDD dopant profile.

While the invention has been particularly shown and described with reference to a preferred embodiment, it will be understood by those skilled in the art that various changes in form and detail may be made therein without departing from the spirit and scope of the invention.

What is claimed is:

1. A method for forming a field effect device for an integrated circuit, comprising the steps of;

forming a gate insulating layer over a semiconductor substrate;

forming a conductive layer over the gate insulating layer;

removing portions of the conductive layer and the gate insulating layer to define a gate electrode for a field effect device;

depositing a first, conformal, insulating layer over the substrate and the gate electrode;

forming a second insulating layer of reflowable glass over the first insulating layer;

heating the glass layer to cause it to partially flow and change slopes of upper surfaces thereof, wherein the slopes of the upper surfaces are more horizontal than a conformally deposited layer above the gate electrode;

anisotropically etching the second and first insulating layers to form sidewall spacers alongside the gate electrode, wherein such spacers have an upper surface which approximates the slope of the previous upper surface of the second insulating layer; and implanting impurities into the substrate to form source/drain regions therein, wherein lightly doped drain regions are formed alongside the gate electrode underneath the sidewall spacers by said implanting step, and wherein the lightly doped drain regions have an impurity profile with a shape approximating the slope of the upper surface of the sidewall spacers.

2. The method of claim 1, wherein the conductive layer is formed from polycrystalline silicon.

3. The method of claim 2, wherein the gate insulating layer is formed from a thermally grown oxide on a silicon substrate.

4. The method of claim 1, wherein said step of anisotropically etching the first and second layers comprises the step of anisotropically etching the first and second layers so that all of the second layer is removed, whereby the spacers include only material from the first insulating layer.

5. The method of claim 1, wherein said step of anisotropically etching the first and second layers comprises the step of anisotropically etching the first and second layers so that small portions of the second layer remain in the spacers.

* * * * *